US007639311B2

(12) United States Patent
Tai

(10) Patent No.: US 7,639,311 B2
(45) Date of Patent: Dec. 29, 2009

(54) CMOS INTEGRATED SUPER-HETERODYNE TELEVISION RECEIVER WITH MULTIPLE SIGNAL PATHS

(75) Inventor: Stephen Tai, Shanghai (CN)

(73) Assignee: Montage Technology Group Limited, George Town, Grand Cayman (KY)

( * ) Notice: Subject to any disclaimer, the term of this patent is extended or adjusted under 35 U.S.C. 154(b) by 781 days.

(21) Appl. No.: 11/338,872

(22) Filed: Jan. 24, 2006

(65) Prior Publication Data
US 2008/0012986 A1    Jan. 17, 2008

(51) Int. Cl.
*H04N 5/50* (2006.01)
*H04N 5/44* (2006.01)
(52) U.S. Cl. .................. 348/731; 348/725; 348/726
(58) Field of Classification Search ......... 348/731–733, 348/725–728, 553; 330/3, 300, 305; 455/552.1, 455/553.1, 180.3, 132–141, 269–278.1; 327/391, 327/359, 433, 565, 437; 334/47, 89; *H04N 5/44, H04N 5/455, 5/50*
See application file for complete search history.

(56) References Cited

U.S. PATENT DOCUMENTS

| | | | |
|---|---|---|---|
| 4,494,082 A | 1/1985 | Bennett | |
| 5,032,900 A | 7/1991 | Sendelweck | |
| 6,949,979 B2* | 9/2005 | Lu et al. .................. | 330/305 |
| 7,046,068 B2* | 5/2006 | Chiu et al. ............... | 327/359 |
| 7,444,166 B2* | 10/2008 | Sahota .................... | 455/553.1 |
| 2004/0005869 A1 | 1/2004 | See et al. | |

OTHER PUBLICATIONS

Stephen Wu and Behzad Razavi, "A 900-MHz/1.8-GHz CMOS Receiver for Dual-Band Applications", IEEE Journal of Solid-State Circuits, vol. 33, No. 12, Dec. 1998.
Sanggyu Sim, Ralph Kuhn, et al., "A Three-Band-Tuner for Digital Terrestrial and Multistandard Reception", IEEE Transactions on Consumer Electronics, vol. 48, No. 3, Aug. 2002.
Mark Dawkins, Alison Payne Burdett, et al., "A Single-Chip Tuner for DVB-T", IEEE Journal of Solid-State Circuits, vol. 38, No. 8, Aug. 2003.
Bud Taddiken, Will Ezell, et al., "Broadband Tuner on a Chip for Cable Modem, HDTV, and Legacy Analog Standards (Invited)", IEEE Radio Frequency Integrated Circuits Symposium, 2002.
Curtis Ling, Raymond Montemayor, et al., "A Low-Power Integrated Tuner for Cable Telephony Applications", IEEE Journal of Solid-State Circuits, vol. 37, No. 12, Dec. 2002.

* cited by examiner

*Primary Examiner*—Sherrie Hsia
(74) *Attorney, Agent, or Firm*—Ivy Mei

(57) ABSTRACT

Integrated super-heterodyne television receivers with multiple signal paths implemented using CMOS technology. An integrated circuit, includes: a plurality of CMOS (Complementary Metal-Oxide Semiconductor) low noise amplifiers; an adjustable frequency source; and one or more down-conversion mixers coupled with the adjustable frequency source and the plurality of CMOS low noise amplifiers to form a plurality of super-heterodyne receiving paths between an input to the plurality of CMOS low noise amplifiers and an output from one or more down-conversion mixers; where the integrated circuit is implemented on a single chip of semiconductive substrate.

19 Claims, 6 Drawing Sheets

CMOS INTEGRATED SUPER-HETERODYNE TELEVISION RECEIVER WITH MULTIPLE SIGNAL PATHS

FIELD OF THE TECHNOLOGY

At least some embodiments of the invention relate to television receiver in general, and more specifically to integrated super-heterodyne television receiver.

BACKGROUND

Two frequencies can be mixed to produce the sum and the difference in a heterodyne process. A super-heterodyne receiver mixes a high frequency input signal with a local frequency generated in a receiver to produce a signal at a frequency that is the difference between the frequency of the input signal and the local frequency generated in the receiver. The produced signal is typically designed to be at a pre-determined frequency, called the intermediate frequency (IF) so that the signal at a high input frequency can be down converted for process at the pre-determined intermediate frequency (IF). The local frequency can be adjusted so that the signal received in the desired channel of frequency can be down converted to the intermediate frequency (IF) for selection and for further processing at the fixed intermediate frequency.

Typically, a television tuner module uses one or more integrated circuits and a number of discrete components, such as low noise amplifiers, mounted on a printed circuit board.

Bud Taddiken, et al. presented a broadband tuner on a chip in 2000 IEEE Radio Frequency Integrated Circuits Symposium, "Broadband Tuner on a chip for cable modem, HDTV, and legacy analog standards (Invited)," pp. 17-20, 2000. In the broadband tuner of Bud Taddiken, et al., the chip was implemented using a silicon BiCMOS process. The low noise amplifier (LNA) in the chip of Bud Taddiken, et al. uses bipolar transistor.

There are two major categories of transistors: bipolar and field effect transistors (FET). FET-based silicon chips are easier to construct than their bipolar counterparts. FETs typically switch slower than bipolar transistors, but use less power.

Metal oxide semiconductor FETs (MOSFETs) includes n-channel based NMOS and p-channel based PMOS. On a chip, NMOS and PMOS transistors can be constructed together in a complementary fashion to create complementary metal oxide semiconductor (CMOS) gates, which consume significantly less power than their bipolar equivalents. A CMOS gate consumes almost no power until the transistors switch.

Bipolar junction transistors (BJTs) are typically used for high power applications and high radio frequency (RF) applications that reach into the gigahertz range. Bipolar transistors are available as individually packaged discrete components as well as on an integrated circuit chip. BiCMOS is type of integrated circuit that uses both bipolar and CMOS technologies.

For convenience, in the present description, it is understood that a BiCMOS chip is not considered as a CMOS chip.

Mark Dawkins, et al. presented a single-chip turner for digital terrestrial television, using a bipolar technology, in "A single-chip tuner for DVB-T," IEEE Journal of Solid-State Circuits, Vol. 38, No. 8, August 2003.

SUMMARY OF THE DESCRIPTION

Integrated super-heterodyne television receivers with multiple signal paths implemented using CMOS technology are described herein. Some embodiments of the invention are summarized in this section.

In one embodiment of the present invention, an integrated circuit includes a plurality of CMOS (Complementary Metal-Oxide Semiconductor) low noise amplifiers; an adjustable frequency source; and one or more down-conversion mixers coupled with the adjustable frequency source and the plurality of CMOS low noise amplifiers to form a plurality of super-heterodyne receiving paths between an input to the plurality of CMOS low noise amplifiers and an output from one or more down-conversion mixers; where the integrated circuit is implemented on a single chip of semi-conductive substrate.

In one embodiment of the present invention, no bipolar transistor is implemented on the single chip of semi-conductive substrate in the integrated circuit. The single chip of semi-conductive substrate is a CMOS integrated circuit chip.

In one embodiment of the present invention, the integrated circuit includes a plurality of variable gain CMOS amplifiers coupled between the plurality of CMOS low noise amplifiers and one or more down-conversion mixers respectively on the plurality of paths.

In one embodiment of the present invention, the integrated circuit further includes a plurality of fixed gain CMOS amplifiers coupled between the plurality of CMOS low noise amplifiers and one or more down-conversion mixers respectively on the plurality of paths.

In one embodiment of the present invention, the integrated circuit further includes a filter coupled with the output for channel selection. The filter is one of a low-pass filter; a band-pass filter; and a complex filter.

In one embodiment of the present invention, the integrated circuit further includes a further CMOS amplifier coupled with the filter. The filter and the further CMOS amplifier share a portion of circuitry.

In one embodiment of the present invention, the integrated circuit includes a plurality of switching elements coupled with inputs of the plurality of CMOS low noise amplifiers respectively. When a selected one of the plurality of switching elements allows signals from the input to go through one of the plurality of CMOS low noise amplifiers, the switching elements other than the selected one prevent the signals from the input to go through the plurality of CMOS low noise amplifiers.

In one embodiment of the present invention, the integrated circuit further includes a plurality of switching elements coupled with outputs of the one or more down-conversion mixers respectively to selectively output from one of one or more down-conversion mixers.

In one embodiment of the present invention, where when a selected one of one or more down-conversion mixers is in a state to provide signals to the output, the one or more down-conversion mixers other than the selected one are switched to a high impedance state.

In one embodiment of the present invention, an integrated television tuner includes a CMOS (Complementary Metal-Oxide Semiconductor) integrated circuit, where the CMOS integrated circuit includes: a phase lock loop; a plurality of signal paths, each of the signal paths comprising a low noise amplifier, a first filter and a down-conversion mixer coupled with the phase lock loop; and a second filter; where at most one of the down-conversion mixer provides signals to the second filter to output signals near a predetermined frequency.

In one embodiment of the present invention, each of the signal paths further includes a variable gain transconductance and a fixed gain transconductance in the integrated television tuner.

In one embodiment of the present invention, each of the signal paths includes at least one switching element to selectively turn a corresponding signal path on or off based on a frequency of an output of the phase lock loop in the integrated television tuner.

In one embodiment of the present invention, the CMOS integrated circuit is implemented on a single chip of silicon semiconductive substrate in the integrated television tuner.

In one embodiment of the present invention, a television receiver includes a display device; a CMOS (Complementary Metal-Oxide Semiconductor) integrated circuit to provide input to the display device, where the CMOS integrated circuit includes: a phase lock loop; a plurality of signal paths, each of the signal paths comprising: a low noise amplifier, a first filter, a down-conversion mixer coupled with the phase lock loop, and a switching element to selectively turn a corresponding one of the signal paths on or off as a function of a frequency of an output of the phase lock loop; and a second filter to receive signals from a selected one of the plurality of signal paths to provide signals near a predetermined frequency.

In one embodiment of the present invention, the television receiver includes a display controller coupled to the CMOS integrated circuit and the display device to drive the display device according to signals generated from the CMOS integrated circuit. The CMOS integrated circuit further includes a signal demodulator.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

Figure 1:
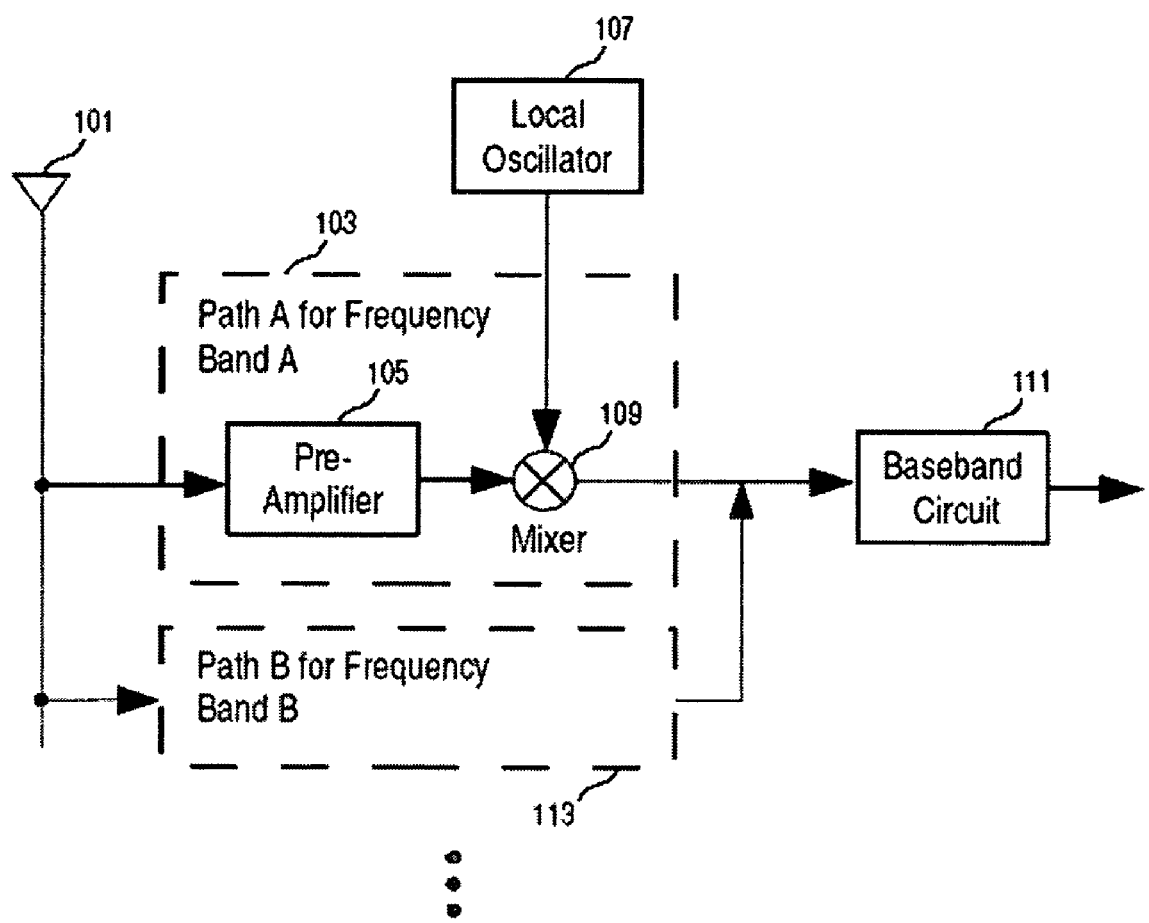
FIG. 1 shows an integrated super-heterodyne television receiver according to one embodiment of the invention.

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

One embodiment of the invention provides a CMOS integrated super-heterodyne television receiver with multiple signal paths. A single CMOS chip is used to implement most components of the turner/receiver, including the low noise amplifiers and down-conversion mixers.

An integrated super-heterodyne television receiver according to embodiments of the invention can be used in terrestrial television or cable television applications. The integration of various components onto a single CMOS chip according to embodiments of the invention greatly reduces the cost of the television receivers.

Television receivers can be used for the reception of digital or analog signals from terrestrial or cable sources. Receivers were implemented using discrete components in the past. Recently, integrated receivers have been developed using bipolar, gallium arsenide or bi-CMOS technologies. The cost of these receivers is high.

One embodiment of the invention uses a CMOS integrated circuit chip to reduce the cost of the television receivers. The CMOS technology has poor linearity, which prevents the receivers to be successfully integrated in the past. To implement integrated CMOS television receivers, one embodiment of the invention addresses the linearity problem of CMOS amplifier for the tuner/receiver portion.

One embodiment of the invention uses multiple signal paths to handle the signals at different frequency bands. Each signal path uses a series of amplifiers and filters to improve the noise rejection ability and linearity within the corresponding frequency band.

CMOS technology provides poorer linearity than bipolar. Traditional implementation of a super-heterodyne television receiver requires an amplifying stage with adequate linearity in the broadband of television signals (e.g., from 50 MHz to 960 MHz). Such an amplifying stage is typically implemented using bipolar technology, such as discrete bipolar components, a separate bipolar integrated circuit, a BiCMOS integrated circuit, etc. Traditional receivers have not been successfully integrated using the CMOS technology.

One embodiment of the invention uses multiple signal paths for different frequency bands so that the CMOS amplifier in each of the signal paths can have adequate linearity for the corresponding frequency band. Even when multiple signal paths are used, the CMOS implementation according to embodiments of the invention can be less costly than a traditional bipolar (e.g., BiCMOS) implementation, without compromising performance. According to one embodiment of the invention, it is possible to implement multiple LNAs and mixers on a single CMOS chip and yet be cost-efficient.

Thus, using multiple signal paths for different frequency bands, a low cost and high performance CMOS television receiver/turner according to embodiments of the invention can be integrated in a single CMOS integrated circuit chip. Such a single CMOS integrated circuit chip can be used to meet the increasing demand of low cost and high performance television receivers without using bipolar or bi-CMOS technologies in implementing television receivers.

FIG. 1 shows an integrated super-heterodyne television receiver according to one embodiment of the invention.

In FIG. 1, the broadband signals from the input (101) are provided to a selected one of the signal paths (e.g., 103, or 113, etc.); and the output of the selected signal path is provided to the base-band circuit (111) for processing at a predetermined intermediate frequency (e.g., lower than the broadband television signals).

In one embodiment of the invention, the base-band circuit includes a channel selection filter. The base-band circuit may further include a signal demodulator. The base-band circuit may further include analog to digital converter and digital signal processor (DSP).

In one embodiment, each of the signal paths (e.g., 103, 113, etc.) is designed to process the signals of a particular frequency band (e.g., the very high frequency (VHF) band, ultra high frequency (UHF) band, or a sub-band of VHF or UHF, etc.).

In one embodiment, each of signal paths (e.g., 103, 113, etc.) includes a pre-amplifier (e.g., 105) and a down-conversion mixer (e.g., 109). The down-conversion mixer (109) is coupled to the output of the local oscillator (107) to down convert the frequency of the signals from the corresponding signal path. The frequency of the local oscillator (107) can be adjusted so that the signals at the desired frequency channel are down converted at the frequency of the base-band circuit. Since the channel selection filter in the base-band circuit is designed to select the signals in the frequency of the base-band circuit, the signal in the desired frequency channel is selected.

Since the signal path is designed to process only a sub-band of the broadband of television signals, the pre-amplifier of each signal path can be implemented using CMOS technology to have adequate linearity for high performance. The signals from different sub-bands of the broadband of television signals reach the base-band circuit through different signal paths. In one embodiment, the signal paths are active to produce output one at a time; and the signal path that is designed to process the desired frequency channel is turned on to produce output to the base-band circuit (111).

In one embodiment, the input signal (e.g., from antenna or television cable) is provided to one signal path a time. The signal path that is designed to process the desired frequency channel is provided with the input signal.

In one embodiment, each signal path includes one or more filters to reduce or limit the gain in pre-amplifying for the signals other than the signals in the desired frequency band. Thus, the output of the pre-amplifier (105) provides adequate linearity for the gain of signals in the desired frequency band and limits the gain for, or filters out, the signals outside the desired frequency band. Thus, after the down conversion, the input signals can be filtered for channel selection.

In one embodiment, a single CMOS chip implements the signal paths (e.g., 103, 113, etc.) and the base-band circuit, which may further include the digital signal processor (DSP).

Figure 2:
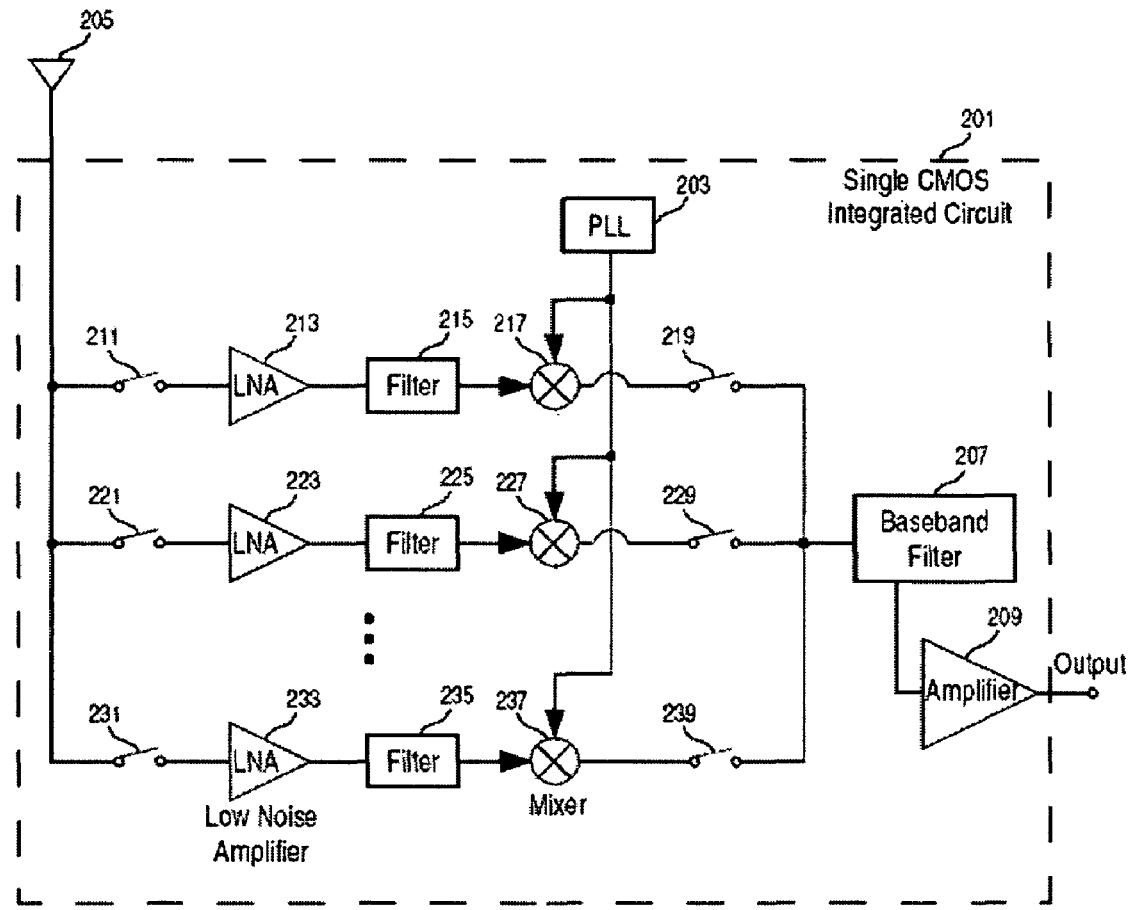
FIGS. 2-3 illustrate examples of block diagrams of integrated circuits of super-heterodyne television receivers according to embodiments of the invention.
Figure 3:
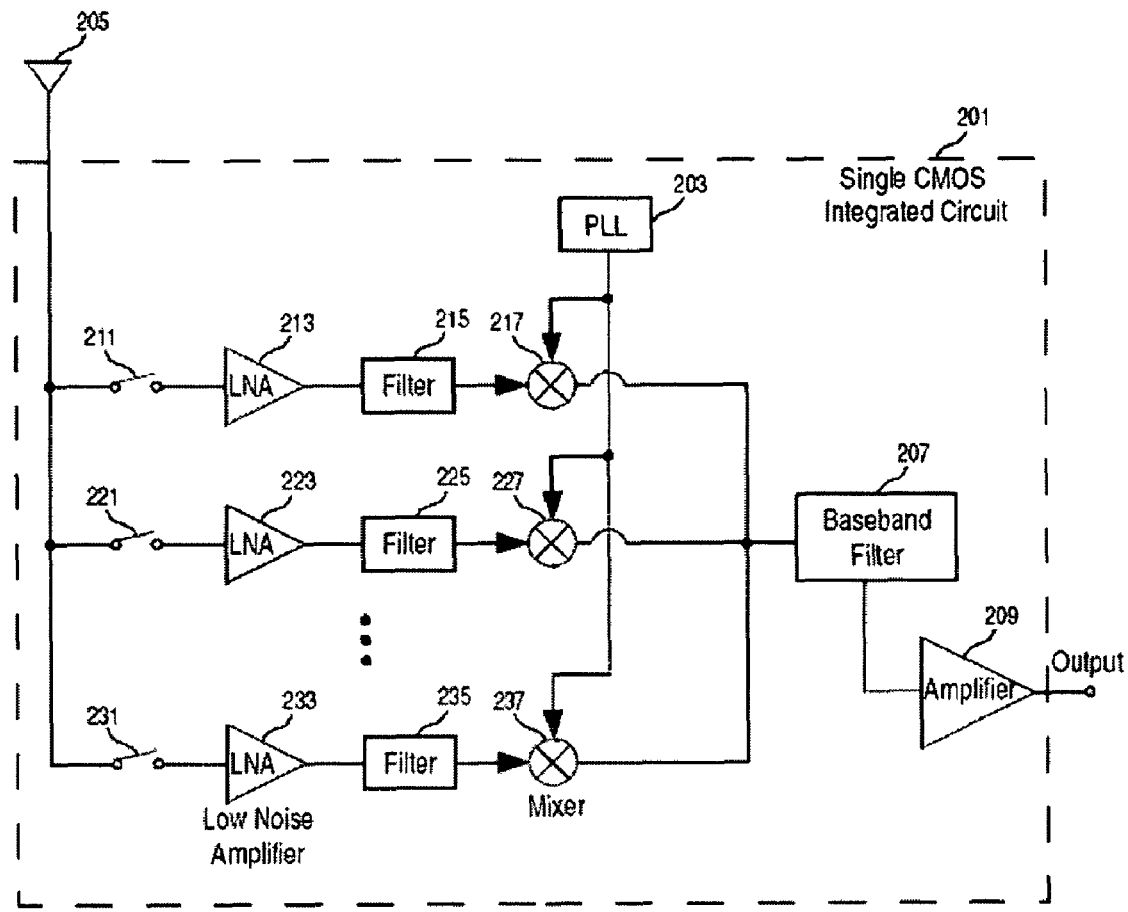

FIGS. 2-3 illustrate examples of block diagrams of integrated circuits of super-heterodyne television receivers according to embodiments of the invention.

In FIG. 2, the single CMOS integrated circuit (201) includes multiple signal paths from switching elements (211, 221, . . . , 231) to switching elements (219, 229, . . . , 239), a phase lock loop (PLL) (203), a base-band filter (207) and a base-band amplifier (209).

In FIG. 2, each of the signal paths includes a low noise amplifier (e.g., 213, 223, . . . , or 233), one or more filters (e.g., 215, 225, . . . , or 235), and a down-conversion mixer (e.g., 217, 227, . . . , or 237).

In one embodiment, each of the signal paths further includes one or more variable gain amplifiers (transconductances) and/or one or more fixed gain amplifiers (transconductances).

Each of the signal paths is designed to have sufficient linearly for a sub-band of the broadband television signals while limits the gain for other sub-bands of the broadband television signals or suppress other sub-bands of the broadband television signals.

In FIG. 2, each of the signal paths includes a switching element (e.g., 211, 221, . . . , 231) to selectively feed the input signal to an active path that is designed to receive the signals of a desired channel. For example, when the receiver/tuner is to receive a channel which is in the sub-band for the path through the low noise amplifier (213), the filter (215) and the down-conversion mixer (217), the switching element (211) of the path provides input (205) to the low noise amplifier (213), while other switching elements (221, . . . , 231) isolate the paths to other mixers (227, . . . , 237) from the input (205).

In FIG. 2, each of the signal paths further includes a switching element (e.g., 219, 229, . . . , 239) to selectively output from one of the signal paths to the baseband filter (207). For example, when the receiver/tuner is to receive a channel which is in the sub-band for the path through the low noise amplifier (213), the filter (215) and the down-conversion mixer (217), the switching element (219) of the path provides input (205) to the base-band filter (207), while other switching elements (229, . . . , 239) isolate the paths other mixers (227, . . . , 237) from the base-band filter (207).

Alternatively, the output of the mixers may be directly connected (summed) to a load, when the output of the mixers is a current, in a way as illustrated in FIG. 3. In FIG. 3, the output of a mixer that is not for the signal path of the selected channel is switched to a high impedance state.

Alternatively, more than one of the signal paths may output at a time. The sum of the output from the combination of the signal paths is designed to provide sufficient linearity for the broadband television signals. For example, all of (or a selected number of) the signal paths may output when the receiver/tuner is tuned to a desired channel. The combination of the outputs from the different signal paths are designed such that the overall output of the multiple paths provides adequate linearity.

In FIG. 2 (or FIG. 3), the base-band filter (207) may include a low-pass filter, a band-pass filter and/or a complex filter. The output from the selected mixer (or the sum of the mixers) is provided to the base-band filter (207) for channel selection.

In FIG. 2 (or FIG. 3), the base-band amplifier (209) with variable or fixed gain is placed after the filter. Alternatively, the base-band amplifier (209) may be placed before the filter. Alternatively, one amplifier (209) may be placed before the filter and another after the filter.

In one embodiment, the base-band amplifier (209) and the base-band filter (207) may share a port of circuitry. For example, the amplifiers may implement part of the filtering action.

In one embodiment, the input signal of the receiver is passed to two or more low noise amplifiers (LNA) of a signal path through switching elements. The input device of the LNA may be considered as a form of switching elements, since when the input device is turned off there will be no input along the signal path.

In one embodiment, multiple low noise amplifiers are used such that each amplifier can handle a different frequency range. Thus, when multiple low noise amplifiers are combined, the linearity and noise rejection ability of the system can be improved.

In one embodiment, each low noise amplifier is followed by a series of variable gain amplifiers to improve the dynamic range of the system. The variable gain amplifiers are also tuned so that the linearity and noise rejection ability is enhanced. Since each signal path is handling only a fraction of the signal frequency at the input of the receiver, the linearity requirements of the each individual amplifier can be relaxed without any impact on the overall performance.

In one embodiment, each of the signal paths has a variable gain amplifier which outputs to a corresponding individual down-conversion quadrature mixer. The outputs of the down-conversion quadrature mixers are summed together to provide input to the base-band filter.

In FIG. 3, one signal path is turned on as an active path during the operation, while other signal paths are turned off by the switching elements coupled to the input (205). The signal band on the active path is down-converted, even though the outputs of the down-conversion mixers appear to be summed together.

In FIG. 2 (or FIG. 3), the output of the active mixer includes the signal of the desired channel at the predetermined intermediate frequency that is lower than the original frequency of the television signals. The output of the active mixer may also contain signals from other higher frequency channels. To select the signals from the desired television channel, which is down-converted to the intermediate frequency, the signals from the mixer are filtered through a low-pass filter, a band-pass filter, or a complex band-pass filter.

According to one embodiment of the invention, the broadband television signals are processed by multiple signal paths designed for different frequency channel bands, so that different sub-bands of the broadband television signals can be handled by different circuits. A combination of the multiple signal paths provides the desirable overall linearity of the system. Further, in one embodiment, the circuits for the operations in multiple frequency bands are integrated onto a single circuit chip.

Although FIGS. 2 and 3 show embodiments of the invention where each of the signal paths includes a separate down-conversion mixer, it is understood that multiple signal paths (or all of the signal paths) may share a down-conversion mixer. For example, the signal paths may share one down-conversion mixer which is selectively coupled to an active path to down-convert the signal from the active path.

Figure 4:
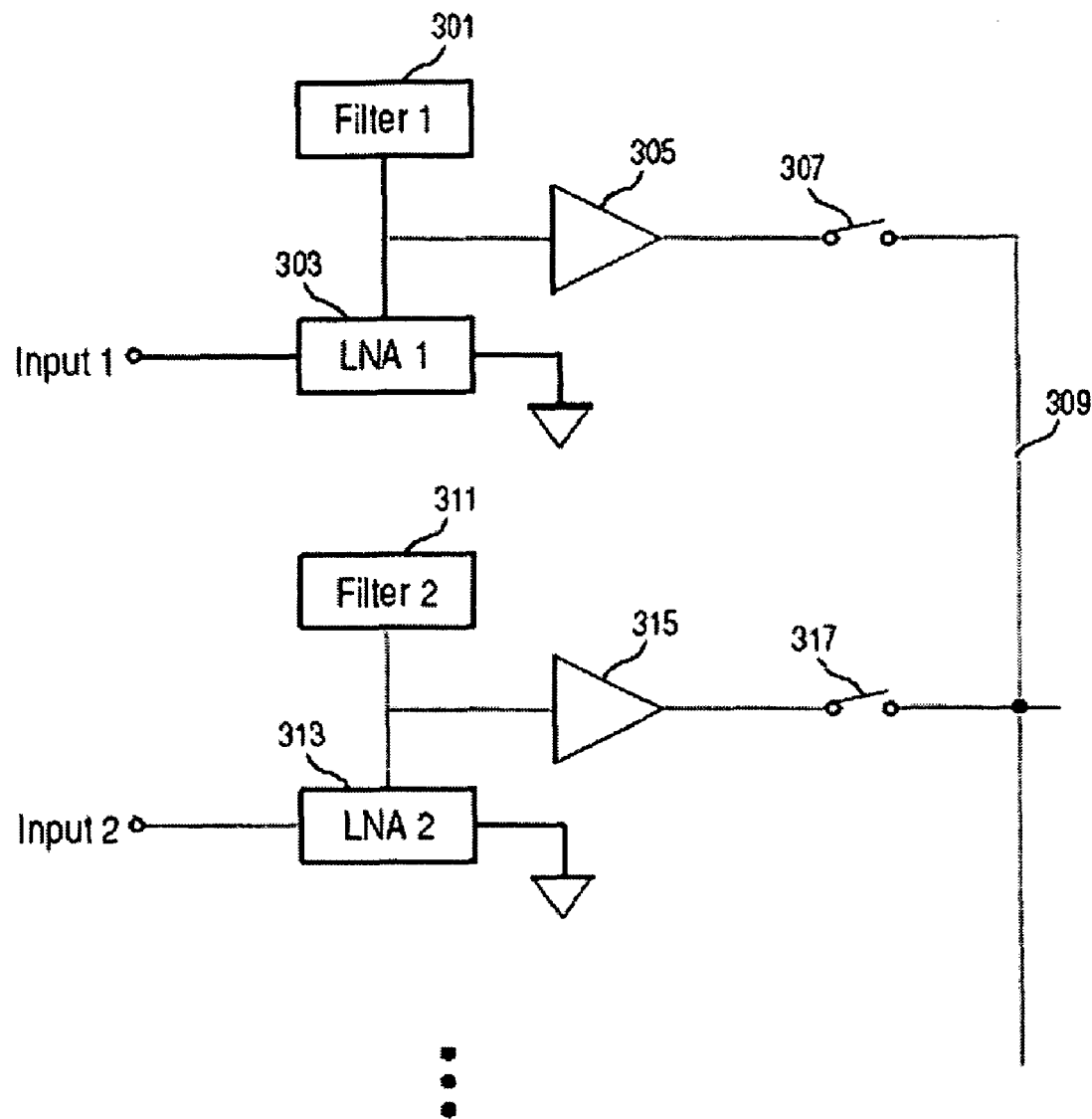
FIG. 4 shows an example of multiple low noise amplifiers for multiple signal paths in an integrated circuit of super-heterodyne television receiver according to one embodiment of the invention.

FIG. 4 shows an example of multiple low noise amplifiers for multiple signal paths in an integrated circuit of super-heterodyne television receiver according to one embodiment of the invention.

In FIG. 4, each signal path includes a low noise amplifier (e.g., 303 or 313), a filter (e.g., 301 or 311), and a variable or fixed gain amplifier (e.g., 305 or 315) and a switching element (e.g., 307 or 317). In FIG. 4, the outputs of the amplifiers of the signal paths are selectively coupled to the output (309) which can be used to provide an input to a down-conversion mixer (not shown in FIG. 4) shared by the multiple signal paths.

Figure 5:
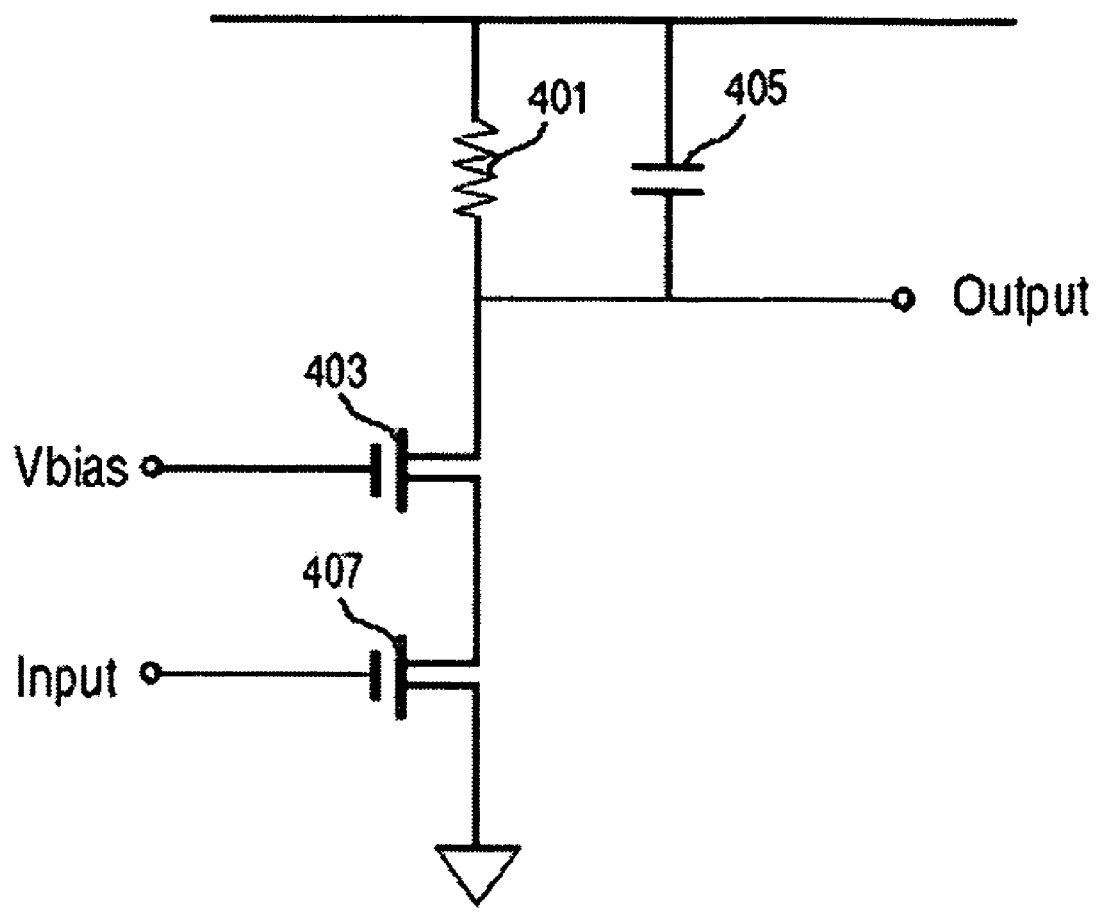
FIG. 5 shows an example of a low noise amplifier which can be used in an integrated circuit of super-heterodyne television receiver according to one embodiment of the invention.

FIG. 5 shows an example of a low noise amplifier which can be used in an integrated circuit of super-heterodyne television receiver according to one embodiment of the invention.

In FIG. 5, a low noise amplifier includes gates (403 and 407), resistor (401) and capacitor (405). The low noise amplifier uses resistive load, although inductors may also be used. Resistive loads are much smaller than inductors and hence save die area.

In FIG. 5, the resistive load with a capacitor (405) is used to provide a filtering effect of the load. Thus, the filter and the low noise amplifier share a portion of the circuitry.

FIGS. 2-5 show specific example implementations of the invention. In general, any kind of low noise amplifiers can be used. The invention is not limited to any specific implementation.

Figure 6:
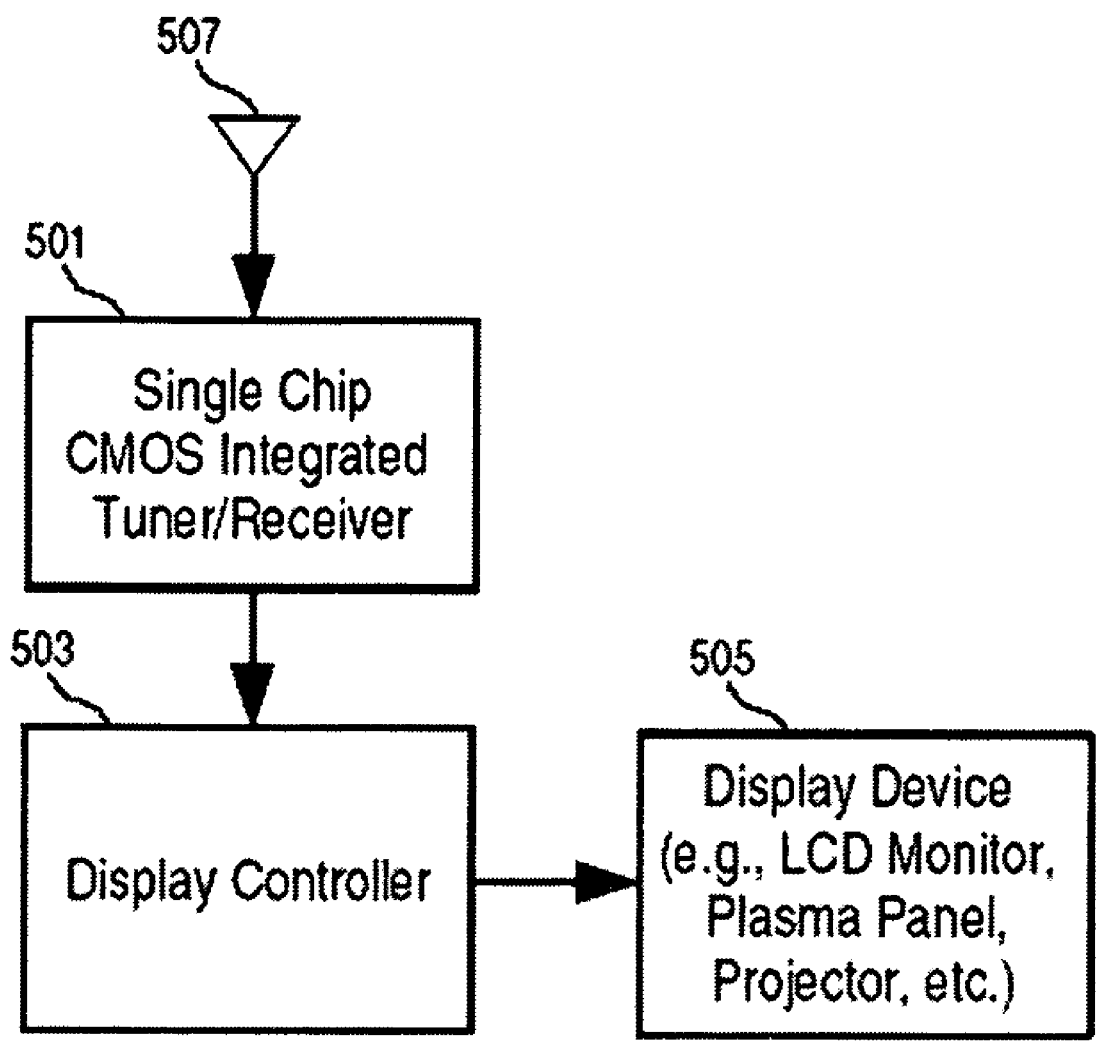
FIG. 6 shows a television set according to one embodiment of the present invention.

FIG. 6 shows a television set according to one embodiment of the present invention.

In FIG. 6, the television signals (e.g., for Digital Video Broadcasting-Cable (DVB-C) or Digital Video Broadcasting-Terrestrial (DVB-T)) are received in a single chip CMOS integrated tuner/receiver (501), which tunes to a specific channel and processes the signals using a digital signal processor to output digital television signals.

In FIG. 6, the digital television signals from the single chip CMOS integrated tuner/receiver (501) is used to drive the display controller (503) which controls the display device (505) to show the television programs. The display device may be a liquid crystal display (LCD) monitor, a plasma panel, a projector, or others.

In one embodiment, the television set may further include a microprocessor and memory which stores instructions for execution on the microprocessor (not show in FIG. 6). The digital television signals for the single chip CMOS integrated tuner/receiver (501) can be further processed by the microprocessor to drive the display controller. For example, the television set may use architecture of a computer.

In one embodiment, the single chip CMOS integrated tuner/receiver (501) may further include the microprocessor and memory.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An integrated circuit, comprising:
   a plurality of CMOS (Complementary Metal-Oxide Semiconductor) low noise amplifiers;
   an adjustable frequency source; and
   one or more downconversion mixers coupled with the adjustable frequency source and the plurality of CMOS low noise amplifiers to form a plurality of superheterodyne receiving paths between an input to the plurality of CMOS low noise amplifiers and an output from one or more downconversion mixers;
   wherein each path of the plurality of superheterodyne receiving paths comprises at least one switching element to selectively turn the path on or off; and
   the integrated circuit is implemented on a single chip of semiconductive substrate.

2. The integrated circuit of claim 1, wherein no bipolar transistor is implemented on the single chip of semiconductive substrate.

3. The integrated circuit of claim 1, wherein the single chip of semiconductive substrate is a CMOS integrated circuit chip.

4. The integrated circuit of claim 1, further comprising:
a plurality of variable gain CMOS amplifiers coupled between the plurality of CMOS low noise amplifiers and one or more downconversion mixers respectively on the plurality of paths.

5. The integrated circuit of claim 1, further comprising:
a plurality of switching elements coupled with inputs of the plurality of CMOS low noise amplifiers respectively.

6. The integrated circuit of claim 5, wherein when a selected one of the plurality of switching elements allows signals from the input to go through one of the plurality of CMOS low noise amplifiers, the switching elements other than the selected one prevent the signals from the input to go through the plurality of CMOS low noise amplifiers.

7. The integrated circuit of claim 1, further comprising:
a plurality of switching elements coupled with outputs of the one or more downconversion mixers respectively to selectively output from one of one or more downconversion mixers.

8. The integrated circuit of claim 1, wherein when a selected one of one or more downconversion mixers is in a state to provide signals to the output, the one or more downconversion mixers other than the selected one are switched to a high impedance state.

9. An integrated circuit, comprising:
a plurality of CMOS (Complementary Metal-Oxide Semiconductor) low noise amplifiers;
an adjustable frequency source;
one or more downconversion mixers coupled with the adjustable frequency source and the plurality of CMOS low noise amplifiers to form a plurality of superheterodyne receiving paths between an input to the plurality of CMOS low noise amplifiers and an output from one or more downconversion mixers;
a plurality of variable gain CMOS amplifiers coupled between the plurality of CMOS low noise amplifiers and one or more downconversion mixers respectively on the plurality of paths; and
a plurality of fixed gain CMOS amplifiers coupled between the plurality of CMOS low noise amplifiers and one or more downconversion mixers respectively on the plurality of paths;
wherein the integrated circuit is implemented on a single chip of semiconductive substrate.

10. The integrated circuit of claim 9, further comprising:
a filter coupled with the output for channel selection.

11. The integrated circuit of claim 10, wherein the filter is one of:
a lowpass filter;
a band pass filter; and
a complex filter.

12. The integrated circuit of claim 10, further comprising:
a further CMOS amplifier coupled with the filter.

13. The integrated circuit of claim 12, wherein the filter and the further CMOS amplifier share a portion of circuitry.

14. An integrated television tuner including a CMOS (Complementary Metal-Oxide Semiconductor) integrated circuit, the CMOS integrated circuit comprising:
a phase lock loop;
a plurality of signal paths, each of the signal paths comprising a low noise amplifier, a first filter and a downconversion mixer coupled with the phase lock loop; and
a second filter;
wherein at most one of the downconversion mixer provides signals to the second filter to output signals near a predetermined frequency; and
wherein each of the signal paths comprises at least one switching element to selectively turn a corresponding signal path on or off based on a frequency of an output of the phase lock loop.

15. The integrated television tuner of claim 14, wherein each of the signal paths further comprises a variable gain transconductance and a fixed gain transconductance.

16. The integrated television tuner of claim 14, wherein the CMOS integrated circuit is implemented on a single chip of silicon semiconductive substrate.

17. A television receiver, comprising:
a display device;
a CMOS (Complementary Metal-Oxide Semiconductor) integrated circuit to provide input to the display device, the CMOS integrated circuit comprising:
a phase lock loop;
a plurality of signal paths, each of the signal paths comprising: a low noise amplifier, a first filter, a downconversion mixer coupled with the phase lock loop, and a switching element to selectively turn a corresponding one of the signal paths on or off as a function of a frequency of an output of the phase lock loop; and
a second filter to receive signals from a selected one of the plurality of signal paths to provide signals near a predetermined frequency.

18. The television receiver of claim 17, further comprising:
a display controller coupled to the CMOS integrated circuit and the display device to drive the display device according to signals generated from the CMOS integrated circuit.

19. The television receiver of claim 18, wherein the CMOS integrated circuit further comprises a signal demodulator.

* * * * *